United States Patent
Yu et al.

(10) Patent No.: US 10,840,578 B2
(45) Date of Patent: Nov. 17, 2020

(54) ANTENNA ARRAY MODULE AND MANUFACTURING METHOD THEREOF

(71) Applicant: Industrial Technology Research Institute, Hsin-Chu (TW)

(72) Inventors: Jiun-Jang Yu, Hsinchu (TW); Chun-An Lu, New Taipei (TW); Hong-Ching Lin, Kaohsiung (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 0 days.

(21) Appl. No.: 16/518,000

(22) Filed: Jul. 22, 2019

(65) Prior Publication Data

US 2020/0052362 A1 Feb. 13, 2020

Related U.S. Application Data

(60) Provisional application No. 62/716,411, filed on Aug. 9, 2018.

(30) Foreign Application Priority Data

Jan. 16, 2019 (TW) .............................. 108101618 A

(51) Int. Cl.
*H01Q 1/22* (2006.01)
*H01Q 1/02* (2006.01)
*H01Q 1/48* (2006.01)

(52) U.S. Cl.
CPC .............. *H01Q 1/02* (2013.01); *H01Q 1/2283* (2013.01); *H01Q 1/48* (2013.01)

(58) Field of Classification Search
CPC .......... H01Q 1/2283; H01Q 1/02; H01Q 1/48; H01Q 1/38; H01Q 21/0087; H01Q 21/065;
(Continued)

(56) References Cited

U.S. PATENT DOCUMENTS 6,388,623 B1 5/2002 Sakota et al.
6,535,168 B1 * 3/2003 Marumoto ............... H01Q 3/26
343/700 MS
(Continued)

FOREIGN PATENT DOCUMENTS

CN 107438919 12/2017
CN 107959109 4/2018
(Continued)

OTHER PUBLICATIONS

TW OA issued on Feb. 5, 2020.

*Primary Examiner* — Haissa Philogene
(74) *Attorney, Agent, or Firm* — WPAT, PC

(57) ABSTRACT

An antenna array module is provided, which includes a circuit layer, an antenna dielectric layer, a metal plate and a chip. The circuit layer includes a signal line, a ground layer and a first dielectric material; the ground layer includes a coupling slot, and the signal line is connected to the chip. The antenna dielectric layer is disposed on the circuit layer and the antenna dielectric layer includes a second dielectric material; the thermal conductivity coefficient of the second dielectric material is lower than the thermal conductivity coefficient of the first dielectric material. The metal plate is disposed on the antenna dielectric layer; the signal line is coupled to the metal plate via the coupling slot.

18 Claims, 10 Drawing Sheets

(58) Field of Classification Search
CPC .............. H01Q 21/0025; H01Q 23/00; H01L 21/76835; H01L 23/5222; H01L 23/5329
See application file for complete search history.

(56) References Cited

U.S. PATENT DOCUMENTS

| | | | |
|---|---|---|---|
| 6,809,688 B2 | 10/2004 | Yamada | |
| 6,903,700 B2 | 6/2005 | Maruhashi et al. | |
| 7,102,896 B2 | 9/2006 | Ajioka et al. | |
| 7,110,741 B2 | 9/2006 | Knopik et al. | |
| 7,119,745 B2 | 10/2006 | Gaucher et al. | |
| 7,236,070 B2 | 6/2007 | Ajioka et al. | |
| 7,372,408 B2 | 5/2008 | Gaucher et al. | |
| 7,460,072 B1 | 12/2008 | Goldberger | |
| 7,477,197 B2 | 1/2009 | Zeng et al. | |
| 7,675,465 B2 | 3/2010 | Doan et al. | |
| 8,018,384 B2 | 9/2011 | Floyd et al. | |
| 8,058,714 B2 | 11/2011 | Noll et al. | |
| 8,164,167 B2 * | 4/2012 | Zhang | H01L 23/48 257/659 |
| 8,256,685 B2 * | 9/2012 | Chen | H01Q 1/2283 235/492 |
| 8,269,671 B2 | 9/2012 | Chen et al. | |
| 8,278,749 B2 | 10/2012 | Lachner et al. | |
| 8,648,454 B2 | 2/2014 | Liu et al. | |
| 8,766,855 B2 | 7/2014 | Biglarbegian et al. | |
| 8,786,060 B2 | 7/2014 | Yen et al. | |
| 8,816,906 B2 * | 8/2014 | Kamgaing | H01Q 1/2283 342/368 |
| 8,854,277 B2 | 10/2014 | De Graauw et al. | |
| 8,917,210 B2 | 12/2014 | Dang et al. | |
| 8,952,521 B2 | 2/2015 | Wojnowski et al. | |
| 9,153,542 B2 | 10/2015 | Lin et al. | |
| 9,172,131 B2 | 10/2015 | Chen et al. | |
| 9,172,132 B2 | 10/2015 | Kam et al. | |
| 9,196,951 B2 | 11/2015 | Baks et al. | |
| 9,252,491 B2 | 2/2016 | Liu et al. | |
| 9,620,464 B2 | 4/2017 | Baks et al. | |
| 9,653,415 B2 | 5/2017 | Lee et al. | |
| 9,935,065 B1 | 4/2018 | Baheti et al. | |
| 10,727,561 B2 * | 7/2020 | Kirino | H01P 3/16 |
| 2010/0327068 A1 | 12/2010 | Chen et al. | |
| 2011/0294264 A1 | 12/2011 | Lu | |
| 2012/0068906 A1 | 3/2012 | Asher et al. | |
| 2012/0280860 A1 | 11/2012 | Kamgaing et al. | |
| 2017/0236776 A1 | 8/2017 | Huynh et al. | |
| 2018/0253002 A1 * | 9/2018 | Shi | G03F 7/16 |

FOREIGN PATENT DOCUMENTS

| | | |
|---|---|---|
| JP | 2005333203 | 12/2005 |
| TW | I443907 | 7/2014 |
| TW | I586240 | 6/2017 |
| WO | WO2017/212160 A1 | 12/2017 |

* cited by examiner

ANTENNA ARRAY MODULE AND MANUFACTURING METHOD THEREOF

CROSS REFERENCE TO RELATED APPLICATION

All related applications are incorporated by reference. The application is based on, and claims priority from, U.S. Provisional Application No. 62/716,411, filed on Aug. 9, 2018, and Taiwan Application Serial Number 108101618, filed on Jan. 16, 2019, the disclosure of which is hereby incorporated by reference herein in its entirety.

TECHNICAL FIELD

The technical field relates to an antenna, in particular to an antenna array module. The technical field further relates to the manufacturing method of the antenna array module.

BACKGROUND

Fifth generation (5G) wireless network system can achieve higher data capacity and faster data transmission, so the development of 5G wireless network system has become the trend in the future Small cells can be applied to 5G wireless network system and can improve the data capacity, data transmission rate and overall network efficiency thereof. Thus, small cells can effectively enhance the service quality of 5G wireless network system. To develop a high-gain phase array antenna becomes an important issue.

Phased antenna arrays are important components for small cells. A phased antenna array usually includes a plurality of antenna array modules (antenna units) and these antenna array modules are driven by chips disposed therein. The design of antenna array modules will significantly influence the performance of phased array antennas. Due to the structural and material limitations of the existing antenna array modules, the heat generated by these antennas cannot be effectively dissipated, thereby affecting the performance of the antenna array module. In addition, considering antenna materials, heat dissipation and radiation gain could become a tradeoff.

SUMMARY

An embodiment of the disclosure relates to an antenna array module, which includes a circuit layer, an antenna dielectric layer, a metal plate and a chip. The circuit layer includes a signal line, a ground layer and a first dielectric material; the ground layer includes a coupling slot, and the signal line is connected to the chip. The antenna dielectric layer is disposed on the circuit layer and the antenna dielectric layer includes a second dielectric material; the thermal conductivity coefficient of the second dielectric material is lower than the thermal conductivity coefficient of the first dielectric material. The metal plate is disposed on the antenna dielectric layer; the signal line is coupled to the metal plate via the coupling slot.

Another embodiment of the disclosure relates to a method for manufacturing an antenna array module, which includes the following steps: forming a multi-layer stack structure including a signal line, a ground layer having a coupling slot and a first dielectric material to serve as a circuit layer, and forming a lateral cooling electrode at one side of the circuit layer; forming a second dielectric material on the circuit layer to serve as an antenna dielectric layer, wherein the thermal conductivity coefficient of the second dielectric material is less than the thermal conductivity coefficient of the first dielectric material; forming a metal plate on the antenna dielectric layer; and connecting the chip to the signal line.

Further scope of applicability of the application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The disclosure will become more fully understood from the detailed description given herein below and the accompanying drawings which are given by way of illustration only, and thus are not limitative of the disclosure and wherein.

DETAILED DESCRIPTION

Figure 1:
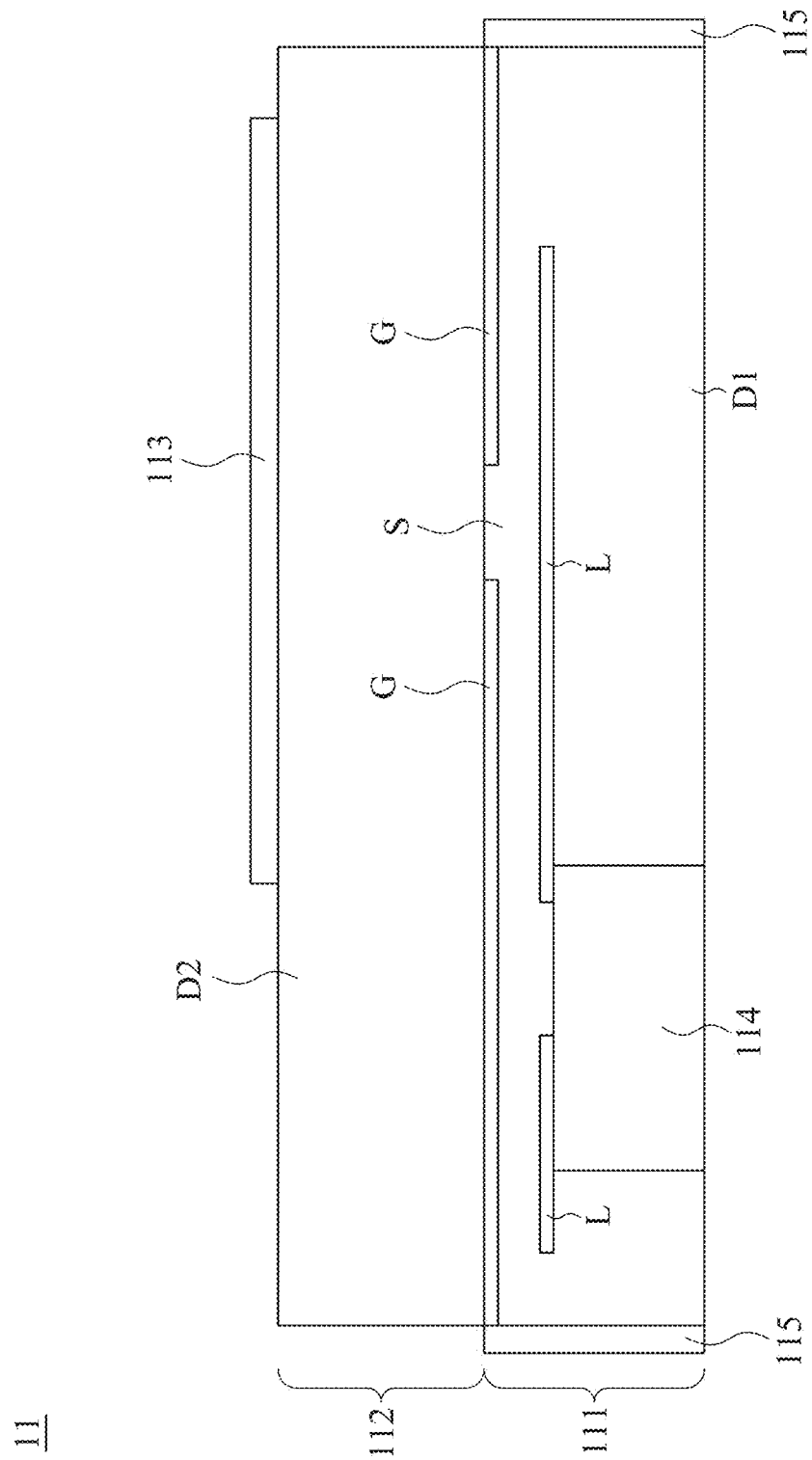
FIG. 1 is a sectional view of an antenna array module in accordance with a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a sectional view of an antenna array module 11 in accordance with a first embodiment of the disclosure. As shown in FIG. 1, the antenna array module 11 includes a circuit layer 111, an antenna dielectric layer 112, a metal plate 113, a chip 114 and plural lateral cooling electrodes 115.

The circuit layer 111 includes a plurality of signal lines L, a ground layer G and a first dielectric material D1. The chip 114 and the signal lines L are disposed in the first dielectric material D1, and the chip 114 is connected to the signal lines L. Besides, the ground layer G includes a coupling slot S.

The antenna dielectric layer 112 is disposed on the circuit layer 111, and the antenna dielectric layer 112 includes a second dielectric layer D2. The thermal conductivity coefficient of the second dielectric material D2 is less than that of the first dielectric material D1. In the embodiment, the thermal conductivity coefficient of the first dielectric material D1 is 3~6 W/m/K (W stands for watt, the unit of thermal power; m stands for meter, the unit of length; k stands for Kelvin temperature scale).

The thermal conductivity coefficient of the second dielectric material D2 is 0.2~1 W/m/K and the loss tangent thereof is less than 0.008@ 10 GHz. For example, the loss tangent of the second dielectric material D2 may be 0.001~0.005 @ 10 GHz. In another embodiment, the thermal conductivity coefficient of the first dielectric material D1 may be 2~8 W/m/K; the thermal conductivity coefficient of the second dielectric material D2 may be 0.1~1 W/m/K and the loss tangent thereof may be 0.0005~0.008 @ 10 GHz. In still another embodiment, the thermal conductivity coefficient of the first dielectric material D1 may be 2.5~5 W/m/K; the thermal conductivity coefficient of the second dielectric material D2 may be 0.2~0.8 W/m/K and the loss tangent thereof may be 0.0005~0.004@ 10 GHz. For instance, the first dielectric material D1 may be DT-171W or DT-178W (provided by DARFON ELECTRONICS CORP); the thermal conductivity coefficient of these materials is 3 W/m/K. On the other hand, the second dielectric material D2 may be the epoxy molding compounds; the thermal conductivity coefficient and the loss tangent of this material are 0.9 W/m/K and 0.008@10 GHz respectively. For example, the first dielectric material D1 may be Dupont 9K7 and the thermal conductivity coefficient of this material is 4.6 W/m/K. On the other hand, the second dielectric material D2 may be RTduroid®5880; the thermal conductivity coefficient and the loss tangent of this material are 0.2 W/m/K and 0.0009@ 10 GHz respectively. For example, the first dielectric material D1 may be Dupont 9K7 and the thermal conductivity coefficient of this material is 4.6 W/m/K. On the other hand, the second dielectric material D2 may be RO4003C; the thermal conductivity coefficient and the loss tangent of this material are 0.71 W/m/K and 0.0027 @ 10 GHz respectively.

The loss tangent measurement method of the second dielectric material D2 is based on IEC 61189-2-721:2015. IEC 61189-2-721:2015 outlines a way to determine the relative permittivity and loss tangent (also called dielectric constant and dissipation factor) of copper clad laminates at microwave frequencies (from 1 GHz to 20 GHz) using a split post dielectric resonator (SPDR). IEC 61189-2-721:2015 is applicable to copper clad laminates and dielectric base materials.

The metal plate 113 is disposed on the antenna dielectric layer 112. The metal plate 113 is coupled to the signal lines L via the coupling slot S without directly contacting the signal lines L. The millimeter wave signals are transmitted from the signal lines L to the metal plate 113 through the coupling slot S.

The lateral cooling electrodes 115 are disposed on the sides of the circuit layer 111, and connected to the ground layer G. These lateral cooling electrodes 115 can be soldered on a substrate in order to fix the antenna array module 11 on the substrate (not shown in FIG. 1). In addition, the lateral cooling electrodes 115 connect to the signal lines L of the circuit layer 111. In another embodiment, the lateral cooling electrodes 115 may cover the sides of the circuit layer 111. In another embodiment, the lateral cooling electrodes 115 may include a plurality of electrode plates disposed on the sides of the circuit layer 111 and there is an interval between any two adjacent electrode plates. The lateral cooling electrodes 115 may be made of a metal material, such as copper, silver, etc.

As described above, the antenna array module 11 of the embodiment can achieve higher design flexibility and lower difficulty in manufacturing process, so can satisfy the requirements in the future.

More specifically, the antenna array module 11 is a composite material stack structure; the thermal conductivity coefficient of the circuit layer 111 can be different from that of the antenna dielectric layer 112. Besides, the thermal conductivity coefficient of the antenna dielectric layer 112 is less than that of the circuit layer 111 and the loss tangent of the antenna dielectric layer 112 is less than 0.008@10 GHz. The design of the above stack structure not only improves the heat dissipation effect of the antenna array module 11, but also obtains better antenna gain.

In addition, the thermal conductivity coefficient of the antenna dielectric layer 112 is 0.2~1 W/m/K (which is equal to the thermal conductivity coefficient, 0.2~1 W/m/K, of the second dielectric material D2). The thermal conductivity coefficient of the first dielectric material D1 of the circuit layer 11 is 3~6 W/m/K. Since the circuit layer 111 includes plural signal lines L and the ground layer G, the thermal conductivity coefficient of the circuit layer 111 is 4~8 W/m/K.

Moreover, the lateral cooling electrodes 115 can not only fix the antenna array module 11 and transmit signals, but also can directly and effectively dissipate the heat generated by the chip 114.

The embodiment just exemplifies the disclosure and is not intended to limit the scope of the disclosure. Any equivalent modification and variation according to the spirit of the disclosure is to be also included within the scope of the following claims and their equivalents.

Figure 2:
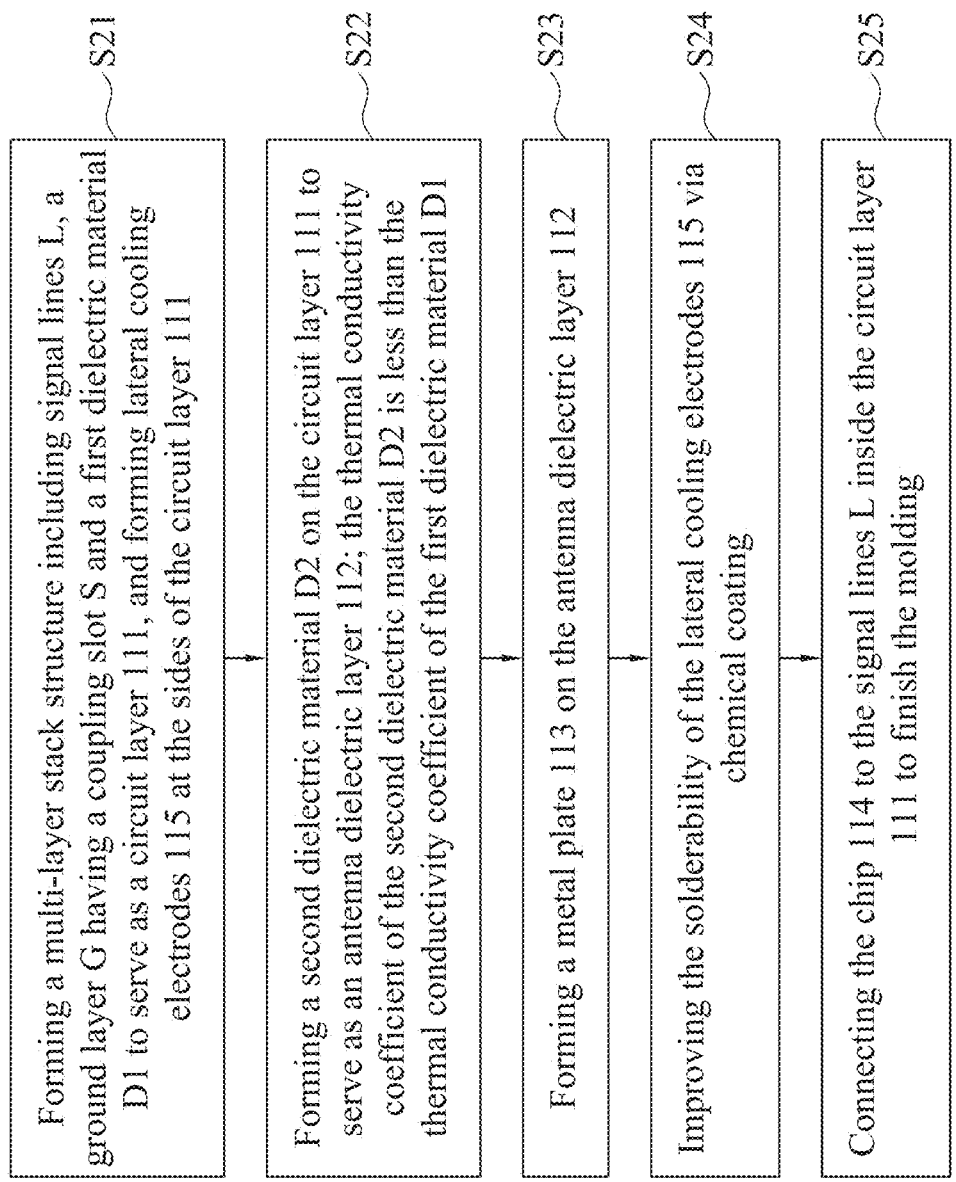
FIG. 2 is a flow chart of a method for manufacturing an antenna array module in accordance with the first embodiment of the disclosure.

Please refer to FIG. 2, which is a flow chart of a manufacturing method of the antenna array module 11 of the first embodiment. The manufacturing method of the antenna array module 11 includes the following steps:

Step S21: forming a multi-layer stack structure including signal lines L, a ground layer G having a coupling slot S and a first dielectric material D1 to serve as a circuit layer 111, and forming lateral cooling electrodes 115 at the sides of the circuit layer 111. The signal lines L, the ground layer G and the coupling slot S can be formed by patterning metals.

Step S22: forming a second dielectric material D2 on the circuit layer 111 to serve as an antenna dielectric layer 112. The thermal conductivity coefficient of the second dielectric material D2 is less than the thermal conductivity coefficient of the first dielectric material D1. The second dielectric material D2 can be formed by coating.

Step S23: forming a metal plate 113 on the antenna dielectric layer 112. The metal plate 113 can be formed by patterning metals. For example, a metal layer can be formed by depositing or sputtering first; then, a portion of the metal layer can be removed by etching process to form the metal plate 113. Alternatively, the metal plate 113 can be formed by coating a metal layer via a mask.

Step S24: improving the solderability of the lateral cooling electrodes 115 via chemical coating.

Step S25: connecting the chip 114 to the signal lines L inside the circuit layer 111 to finish the molding.

Figure 3:
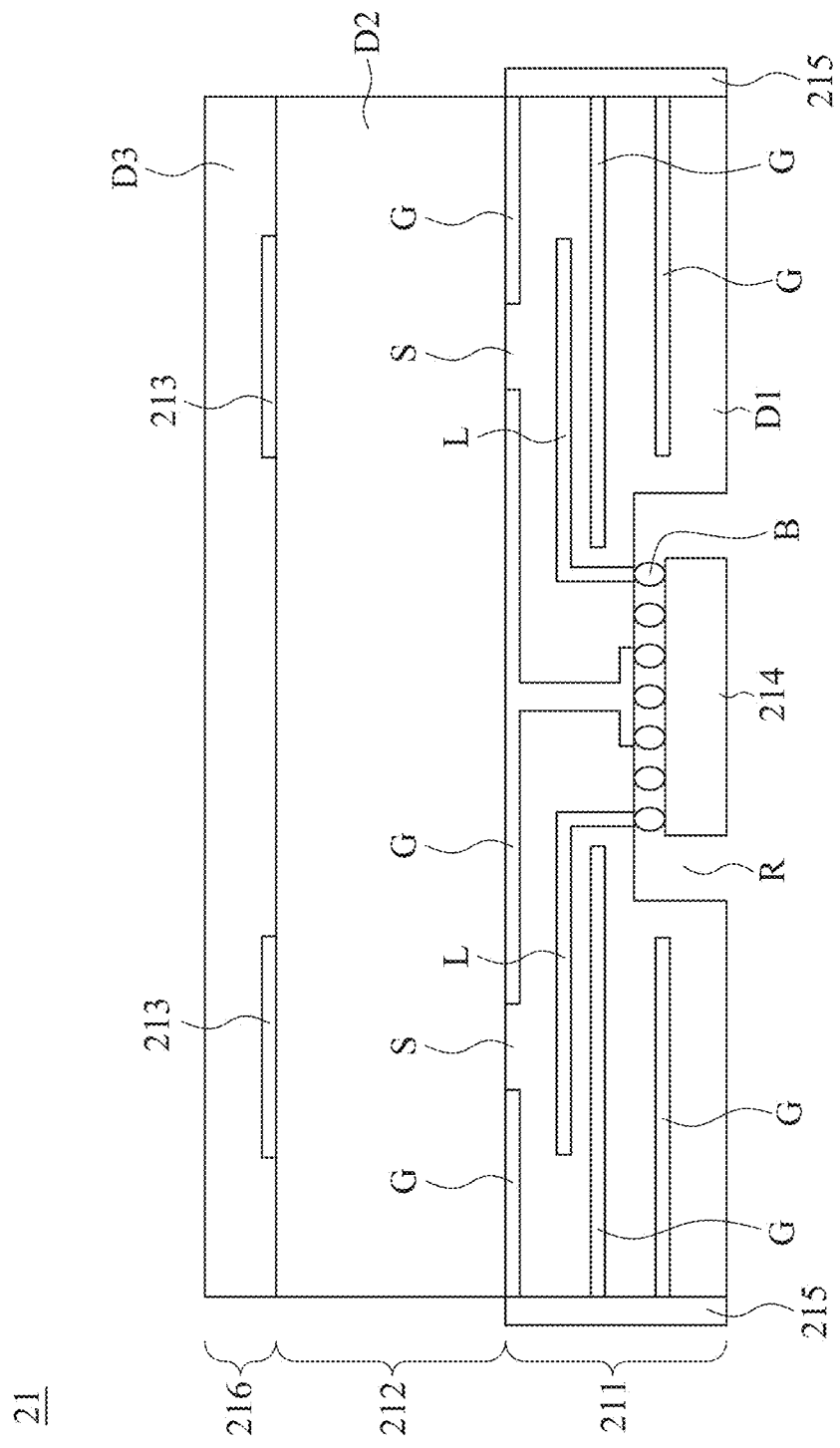
FIG. 3 is a sectional view of an antenna array module in accordance with a second embodiment of the disclosure.

Please refer to FIG. 3, which is a sectional view of an antenna array module 21 in accordance with a second embodiment of the disclosure. As shown in FIG. 3, the antenna array module 21 includes a circuit layer 211, an antenna dielectric layer 212, plural metal plates 213, a chip 214, plural lateral cooling electrodes 215 and an antenna protection layer 216.

The circuit layer 211 includes a plurality of signal lines L, a plurality of ground layers G, a plurality of coupling slots S and a first dielectric material D1. The bottom of the first dielectric material D1 includes a recess R. The chip 214 is disposed in the recess R. Besides, the chip 214 is connected to the signal lines L and fixed on the first dielectric material D1 via the solder balls B.

The antenna dielectric layer 212 is disposed on the circuit layer 211, and the antenna dielectric layer 212 includes a second dielectric material D2. The thermal conductivity coefficient of the second dielectric material D2 is less than that of the first dielectric material D1. In the embodiment, the first dielectric material D1 may be Dupont 9K7 and the thermal conductivity coefficient of this material is 4.6 W/m/K. On the other hand, the second dielectric material D2 may be RO4003C; the thermal conductivity coefficient and the loss tangent of this material are 0.71 W/m/K and 0.0027 @ 10 GHz respectively.

The metal plates 213 are disposed on the antenna dielectric layer 212. The millimeter wave signals are transmitted from the signal lines L to the metal plate 213 through the coupling slot S.

The lateral cooling electrodes 215 are disposed on the sides of the circuit layer 211, and the lateral cooling electrodes 215 are connected to the ground layers G. Similarly, the antenna array module 21 can be fixed on a substrate via the lateral cooling electrodes 215, and the signal lines L of the circuit layer 211 can be connected to the lateral cooling electrodes 215.

The antenna array module 21 can further include an antenna protection layer 216 and the metal plates 213 can be covered by the antenna protection layer 216. In the embodiment, the antenna protection layer 216 includes a third dielectric material D3 and the transmittance of the antenna protection layer 216 is greater than 80%. In another embodiment, the thermal conductivity coefficient of the third dielectric material D3 is 0.2~0.5 W/m/K. In still another embodiment, the thermal conductivity coefficient of the third dielectric material D3 is 0.2~1 W/m/K.

As described above, the antenna array module 21 is a composite material stack structure; the antenna protection layer 216, the circuit layer 211 and the antenna dielectric layer 212 have different thermal conductivity coefficients. For example, the thermal conductivity coefficient of the antenna protection layer 216 may be 0.2~1 W/m/K; the thermal conductivity coefficient of the antenna dielectric layer 212 may be 0.2~1 W/m/K, and the loss tangent thereof may be less than 0.008@ 10 GHz; the thermal conductivity coefficient of the circuit layer 211 may be 4~8 W/m/K.

The embodiment just exemplifies the disclosure and is not intended to limit the scope of the disclosure. Any equivalent modification and variation according to the spirit of the disclosure is to be also included within the scope of the following claims and their equivalents.

Figure 4:
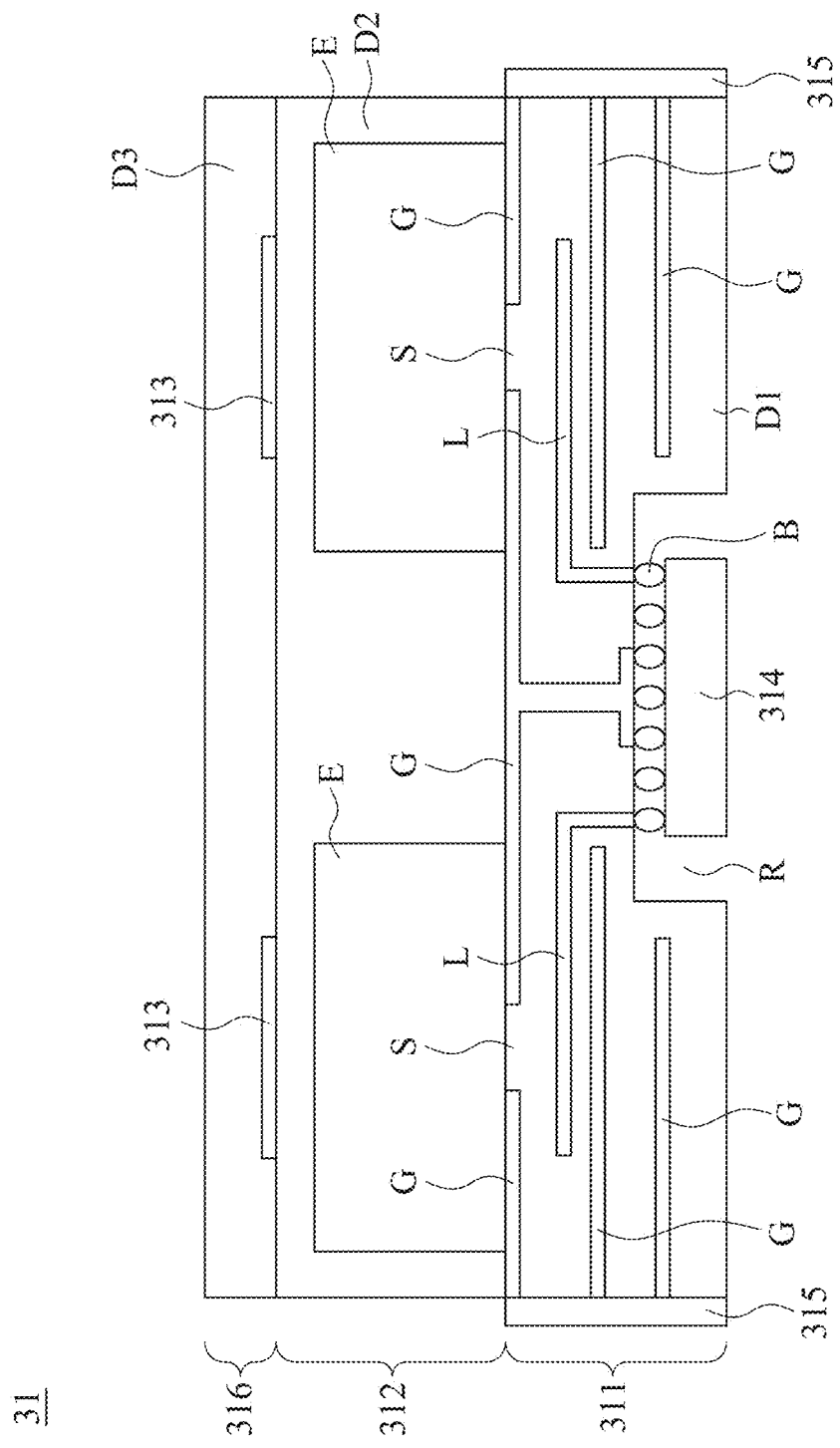
FIG. 4 is a sectional view of an antenna array module in accordance with a third embodiment of the disclosure.

Please refer to FIG. 4, which is a sectional view of an antenna array module 31 in accordance with a third embodiment of the disclosure. As shown in FIG. 4, the antenna array module 31 includes a circuit layer 311, an antenna dielectric layer 312, plural metal plates 313, a chip 314, plural lateral cooling electrodes 315 and an antenna protection layer 316.

The circuit layer 311 includes a plurality of signal lines L, a plurality of ground layers G, a plurality of coupling slots S and a first dielectric material D1. The bottom of the first dielectric material D1 includes a recess R. The chip 314 is disposed in the recess R. Besides, the chip 314 is connected to the signal lines L and fixed on the first dielectric material D1 via the solder balls B.

The antenna dielectric layer 312 is disposed on the circuit layer 311, and the antenna dielectric layer 312 includes a second dielectric material D2.

The metal plates 313 are disposed on the antenna dielectric layer 312. The metal plates 313 is coupled to the signal lines L via the coupling slots S. As such, millimeter wave signals are transmitted from the signal lines L to the metal plate 313 through the coupling slot S.

The antenna protection layer 316 covers the metal plates 313, and the antenna protection layer 316 includes a third dielectric material D3.

The lateral cooling electrodes 315 are disposed on the sides of the circuit layer 311, and the lateral cooling electrodes 315 are connected to the ground layers G.

The structures and the cooperation relations of the above elements are similar to the previous embodiment, so will not be described herein again. The difference between this embodiment and the previous embodiment is that the antenna dielectric layer 312 of the antenna array module 31 further includes a plurality of cavities E. And the cavities E are located between the metal plates 313 and the coupling slots S. The above structure design can enhance the performance of the antenna array module 31, so the applications of the antenna array module 31 can be more comprehensive.

The embodiment just exemplifies the disclosure and is not intended to limit the scope of the disclosure. Any equivalent modification and variation according to the spirit of the disclosure is to be also included within the scope of the following claims and their equivalents.

Figure 5:
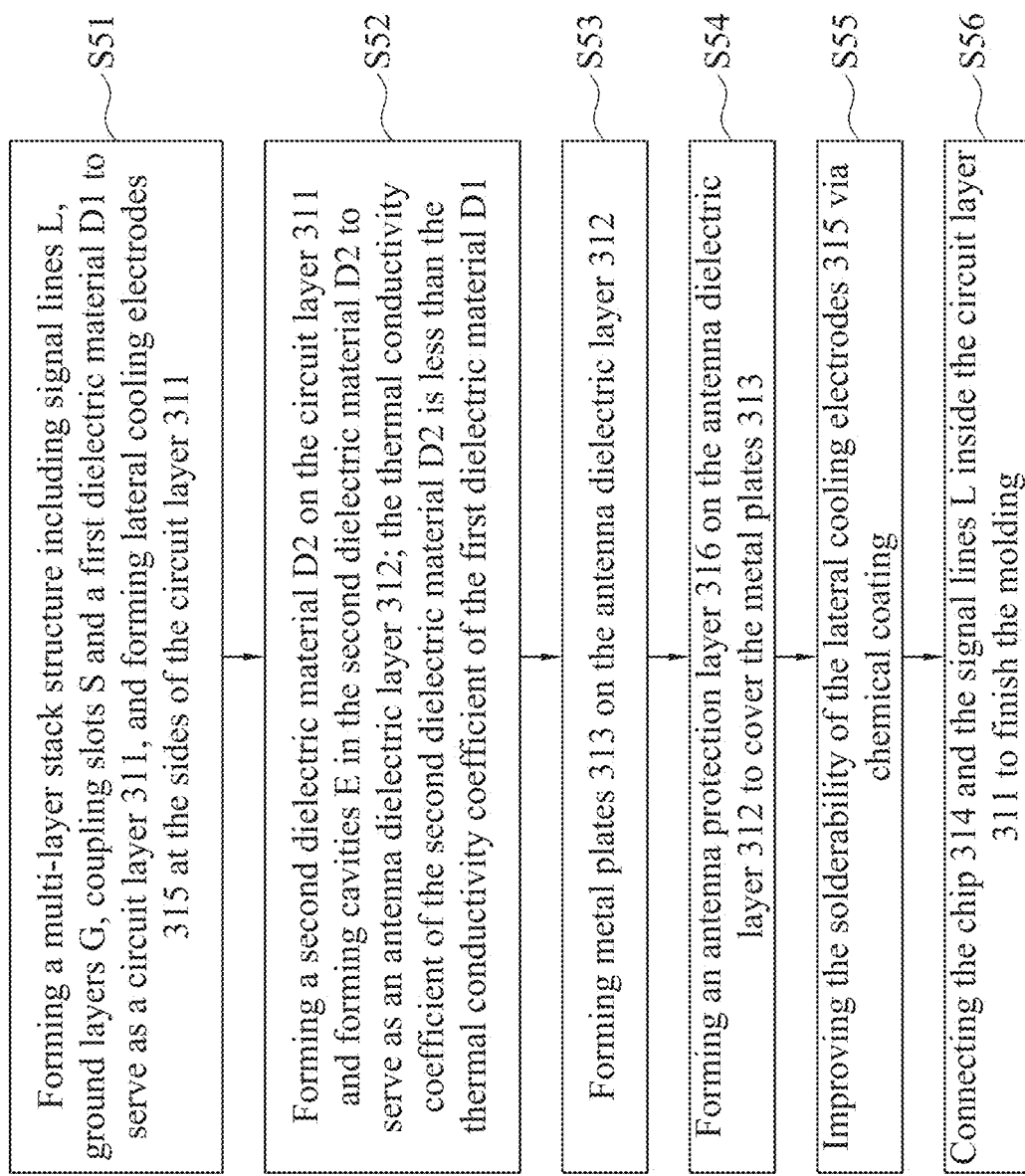
FIG. 5 is a flow chart of a method for manufacturing an antenna array module in accordance with the third embodiment of the disclosure.

Please refer to FIG. 5, which is a flow chart of a manufacturing method of the antenna array module 31 of the third embodiment. The manufacturing method of the antenna array module 31 includes the following steps:

Step S51: forming a multi-layer stack structure including signal lines L, ground layers G, coupling slots S and a first dielectric material D1 to serve as a circuit layer 311, and forming lateral cooling electrodes 315 at the sides of the circuit layer 311. The signal lines L, the ground layers G and the coupling slot S can be formed by patterning metals.

Step S52: forming a second dielectric material D2 on the circuit layer 311 and forming cavities E in the second dielectric material D2 to serve as an antenna dielectric layer 312. The thermal conductivity coefficient of the second dielectric material D2 is less than the thermal conductivity coefficient of the first dielectric material D1. The cavities E can be formed by laser perforating, punching or drilling.

Step S53: forming metal plates 313 on the antenna dielectric layer 312.

Step S54: forming an antenna protection layer 316 on the antenna dielectric layer 312 to cover the metal plates 313.

Step S55: improving the solderability of the lateral cooling electrodes 315 via chemical coating.

Step S56: connecting the chip 314 and the signal lines L inside the circuit layer 311 to finish the molding.

According to one embodiment of the disclosure, the first dielectric material D1 may be Dupont 9K7 and the thermal conductivity coefficient of this material is 4.6 W/m/K. The second dielectric material D2 may be RTduroid®5880; the thermal conductivity coefficient and the loss tangent of the second dielectric material D2 may be 0.2 W/m/K and 0.0009 @ 10 GHz respectively. The thermal conductivity coefficient of the circuit layer 311 of the antenna array module 31 may be 4~8 W/m/K.

Therefore, the heat dissipation effect of the antenna array module 31 not only can be further enhanced, but the antenna array module 31 can have better antenna gain.

Figure 6:
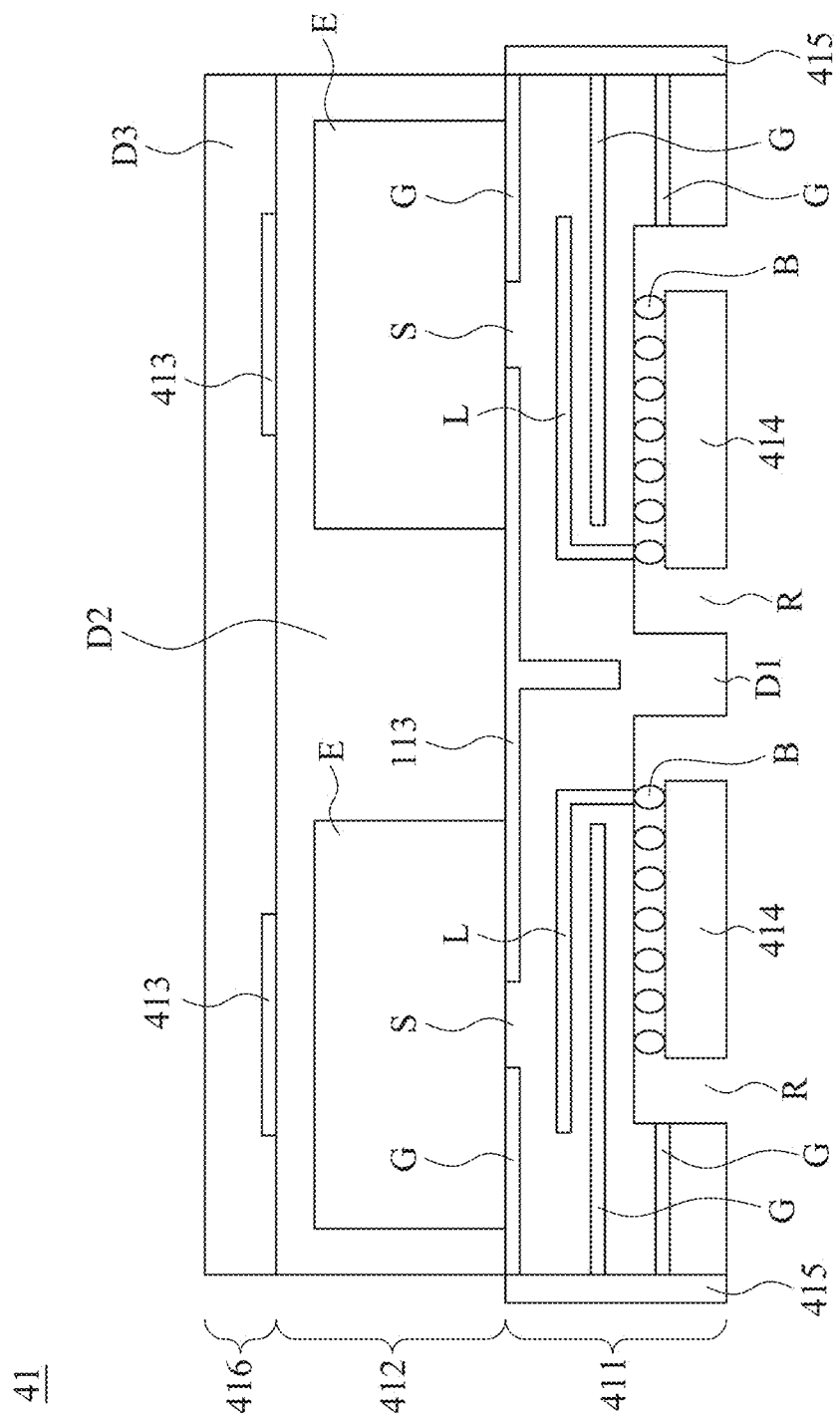
FIG. 6 is a sectional view of an antenna array module in accordance with a fourth embodiment of the disclosure.

Please refer to FIG. 6, which is a sectional view of an antenna array module 41 in accordance with a fourth embodiment of the disclosure. As shown in FIG. 6, the antenna array module 41 includes a circuit layer 411, an antenna dielectric layer 412, plural metal plates 413, plural chips 414, plural lateral cooling electrodes 415 and an antenna protection layer 416.

The circuit layer 411 includes a plurality of signal lines L, a plurality of ground layers G, a plurality of coupling slots S and a first dielectric material D1. The bottom of the first dielectric material D1 includes plural recesses R. The chips 414 are disposed in the recesses R; the chips 414 are connected to the signal lines L and fixed on the first dielectric material D1 via the solder balls B.

The antenna dielectric layer 412 is disposed on the circuit layer 411, and the antenna dielectric layer 412 includes a second dielectric material D2 and a plurality of cavities E. The cavities E are located between the metal plates 413 and the coupling slots S.

The metal plates 413 are disposed on the antenna dielectric layer 412. The metal plates 413 are coupled to the signal lines L via the coupling slots S. As such, millimeter wave signals are transmitted from the signal lines L to the metal plate 413 through the coupling slots S.

The antenna protection layer 416 covers the metal plates 413, and the antenna protection layer 416 includes a third dielectric material D3.

The lateral cooling electrodes 415 are disposed on the sides of the circuit layer 411, and the lateral cooling electrodes 415 are connected to the ground layers G.

The structures and the cooperation relations of the above elements are similar to the previous embodiment, so will not be described herein again. The difference between this embodiment and the previous embodiment is that the antenna array module 41 includes plural chips 414, so can be applied to a large phased array antenna with plural metal plates 413. As described above, the antenna array module 41 according to the embodiment of the disclosure can definitely achieve higher design flexibility.

Similarly, the antenna array module 41 is also a special composite material stack structure; the antenna protection layer 416, the circuit layer 411 and the antenna dielectric layer 412 have different thermal conductivity coefficients. Besides, the thermal conductivity coefficient of the circuit layer 411 is greater than that of the antenna dielectric layer 412. Therefore, the heat dissipation effect of the antenna array module 41 can be significantly enhanced.

The embodiment just exemplifies the disclosure and is not intended to limit the scope of the disclosure. Any equivalent modification and variation according to the spirit of the disclosure is to be also included within the scope of the following claims and their equivalents.

Figure 7:
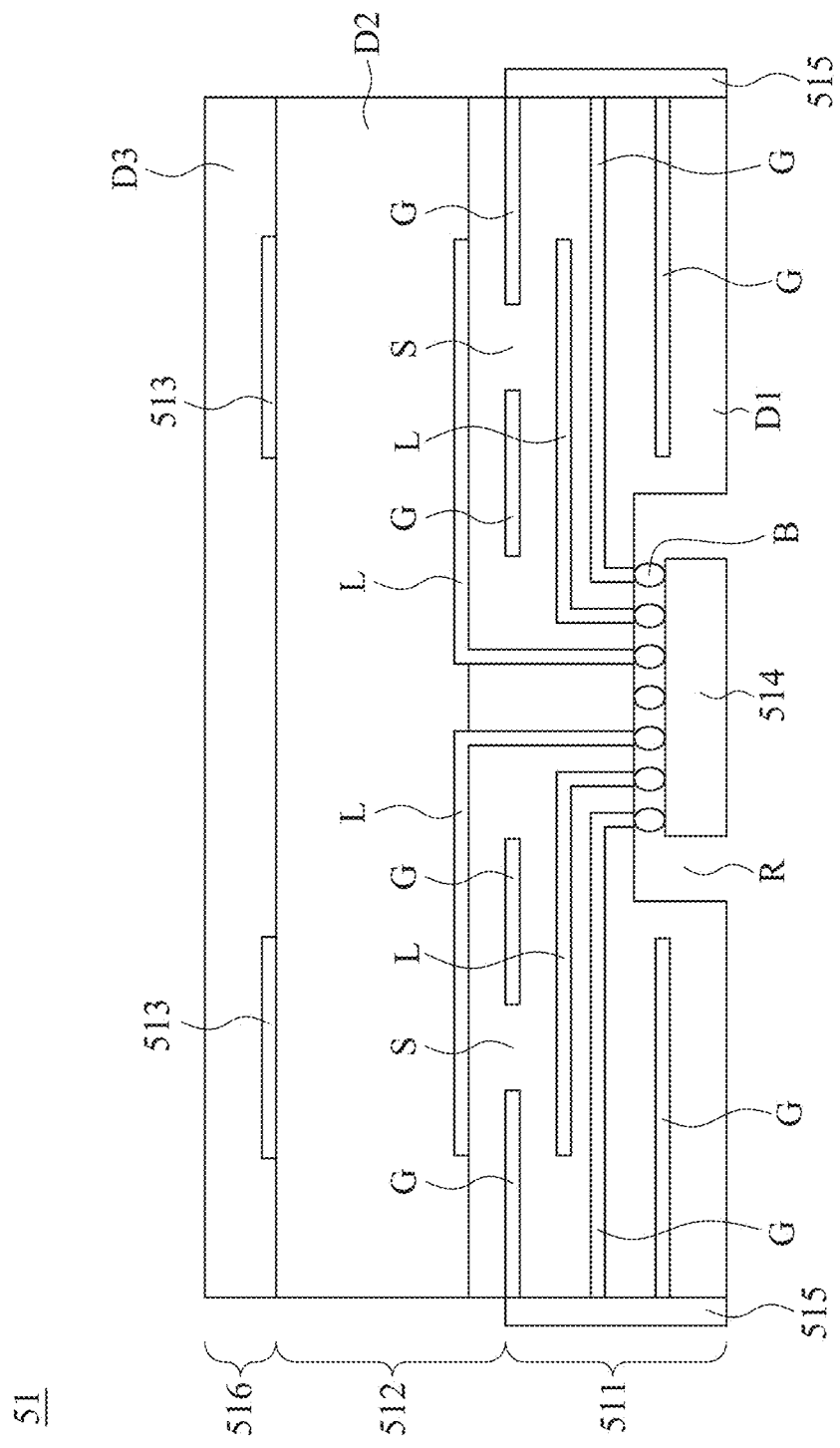
FIG. 7 is a sectional view of an antenna array module in accordance with a fifth embodiment of the disclosure.

Please refer to FIG. 7, which is a sectional view of an antenna array module 51 in accordance with a fifth embodiment of the disclosure. As shown in FIG. 7, the antenna array module 51 includes a circuit layer 511, an antenna dielectric layer 512, plural metal plates 513, a chip 514, plural lateral cooling electrodes 515 and an antenna protection layer 516.

The circuit layer 511 includes a plurality of signal lines L, a plurality of ground layers G, a plurality of coupling slots S and a first dielectric material D1. The bottom of the first dielectric material D1 includes a recess R. The chip 514 is disposed in the recess R; the chip 514 is connected to the signal lines L and fixed on the first dielectric material D1 via the solder balls B. In addition, the signal lines L are distributed above or below each of the coupling slots S.

The antenna dielectric layer 512 is disposed on the circuit layer 511, and the antenna dielectric layer 512 includes a second dielectric material D2.

The metal plates 513 are disposed on the antenna dielectric layer 512. Similarly, the transmission process of millimeter wave signals of the embodiment is the same as that of the previous embodiment. The signal lines L below or above the coupling slots S are coupled to the metal plates 513. The millimeter wave signals generated by the signal lines L below the coupling slots S are transmitted to the metal plates 513 via the coupling slots S. The millimeter wave signals generated by the signal lines L above the coupling slots S are also transmitted to the metal plates 513 via the coupling slots S.

The antenna protection layer 516 covers the metal plates 513, and the antenna protection layer 516 includes a third dielectric material D3.

The lateral cooling electrodes 515 are disposed on the sides of the circuit layer 511, and the lateral cooling electrodes 515 are connected to the ground layers G.

The structures and the cooperation relations of the above elements are similar to the previous embodiment, so will not be described herein again. The difference between this embodiment and the previous embodiment is that the signal lines L can be distributed above or below the ground layers G, which can achieve dual-axis polarization effect. As described above, the antenna array module 51 according to the embodiment of the disclosure can definitely achieve higher design flexibility.

Similarly, the antenna array module 51 is also a special composite material stack structure; the antenna protection layer 516, the circuit layer 511 and the antenna dielectric layer 512 have different thermal conductivity coefficients. Besides, the thermal conductivity coefficient of the circuit layer 511 is greater than that of the antenna dielectric layer 512. Therefore, the heat dissipation effect of the antenna array module 51 can be significantly enhanced.

The embodiment just exemplifies the disclosure and is not intended to limit the scope of the disclosure. Any equivalent modification and variation according to the spirit of the disclosure is to be also included within the scope of the following claims and their equivalents.

Figure 8:
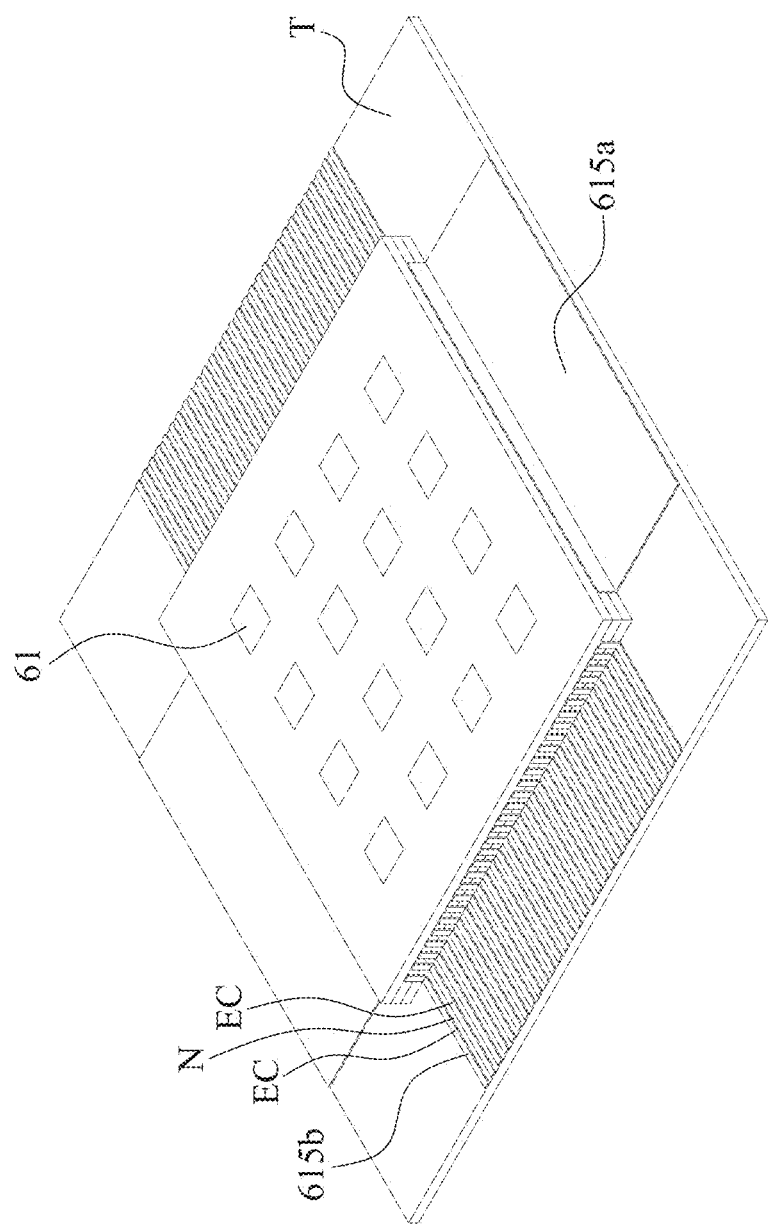
FIG. 8 is a schematic view of an antenna array module in accordance with a sixth embodiment of the disclosure.

Please refer to FIG. 8, which is a schematic view of an antenna array module 61 in accordance with a sixth embodiment of the disclosure. As shown in FIG. 8, each of antenna array modules 61 includes plural antennas and plural chips. The antenna array modules 61 are disposed on a substrate T to form a phased array antenna 1.

As shown in FIG. 8, the phased array antenna 1 includes two types of lateral cooling electrodes 615a and 615b. More specifically, the lateral cooling electrode 615a is an electrode plate disposed at one side of the phased array antenna 1. On the other hand, the lateral cooling electrode 615b includes a plurality of electrode plates EC; the electrode plates EC are metal strips and any two adjacent electrode plates EC are spaced by an interval N.

As described above, the lateral cooling electrodes can have different structures in order to satisfy different requirements and achieve the desired technical effects.

The embodiment just exemplifies the disclosure and is not intended to limit the scope of the disclosure. Any equivalent modification and variation according to the spirit of the disclosure is to be also included within the scope of the following claims and their equivalents.

Figure 9:
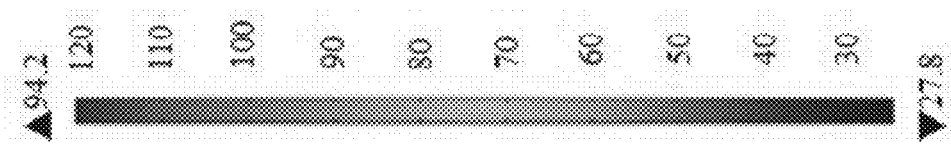
FIG. 9 is a simulation result of an antenna array module in accordance with the sixth embodiment of the disclosure.
Figure 9:
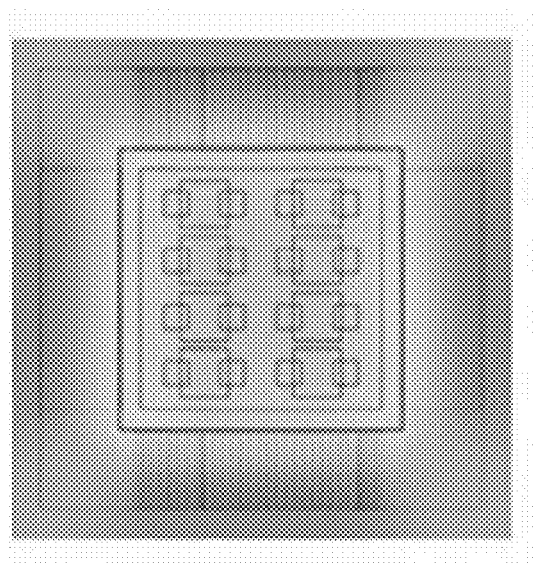
Figure 10:
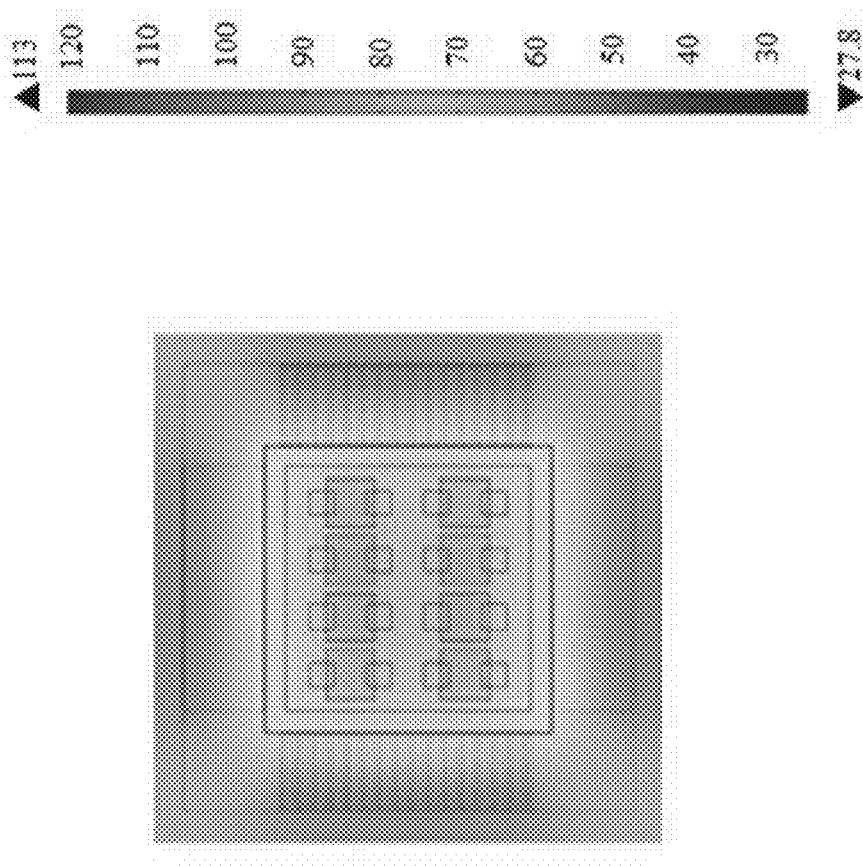
FIG. 10 is a simulation result of a currently available antenna array module.

Please refer to FIG. 9 and FIG. 10. FIG. 9 is a simulation result of the antenna array module 11 of the sixth embodiment; FIG. 10 is a simulation result of a currently available antenna array module. The phased array antenna 1 shown in FIG. 9 adopts the thermal conductivity coefficient range and the heat dissipation structure according to the antenna array module 11. The thermal conductivity coefficient of the antenna dielectric layer 112 of the phased array antenna 1 is 0.3 W/m/K and the thermal conductivity coefficient of the circuit layer 111 of the phased array antenna 1 is 5 W/m/K. As shown in FIG. 9, the highest temperature of the antenna array modules 61 of the phased array antenna 1 is about 94.2° C.

The phased array antenna 1' shown in FIG. 10 does not adopt the thermal conductivity coefficient range and the heat dissipation structure according to the embodiments of the disclosure. As shown in FIG. 10, the highest temperature of the antenna array modules of the phased array antenna 1' is about 113° C. Obviously, the phased array antenna 1 shown in FIG. 9 can achieve better heat dissipation effect.

In summation of the description above, according to one embodiment of the disclosure, as shown in FIG. 1, the antenna array module 11 is a special composite material stack structure, such that the thermal conductivity coefficient of the circuit layer 111 is different from that of the antenna dielectric layer 112. Besides, the antenna dielectric layer 112 is made of a material with low thermal conductivity coefficient and low loss tangent. The design of the above thermal transmission structure not only can effectively improve the heat dissipation effect, but the antenna array module can achieve great antenna gain.

According to one embodiment of the disclosure, the thermal conductivity coefficient of the antenna dielectric layer 112 of the antenna array module 11 is 0.2~1 W/m/K and the loss tangent thereof is lower than 0.008; besides, the thermal conductivity coefficient of the circuit layer 111 is 4~8 W/m/K. The design of the above thermal conductivity coefficient range not only can effectively enhance the heat dissipation effect of the antenna array module 11, but the antenna array module 11 can achieve great antenna gain.

In addition, according to one embodiment of the disclosure, the antenna array module 11 includes the lateral cooling electrodes 115, which not only fixes the antenna array module 11 and transmits signals, but also directly and effectively dissipates the heat generated by the chip 114. Therefore, the heat dissipation effect of the antenna array module 11 can be further enhanced.

Moreover, as shown in FIG. 3, according one embodiment of the disclosure, the antenna array module 21 includes an antenna protection layer 216 and the thermal conductivity coefficient is 0.2~1 W/m/K.

Furthermore, as shown in FIG. 4, according one embodiment of the disclosure, the antenna dielectric layer 312 of the antenna array module 31 includes a cavity E. This structure design can reduce the loss tangent of the antenna dielectric layer 312, which can improve the performance of the antenna array module 31. Thus, the applications of the antenna array module 31 can be more comprehensive.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An antenna array module, comprising:
    a circuit layer comprising a first dielectric material, a signal line, and a ground layer, wherein the signal line and the ground layer are disposed in the first dielectric material, and the ground layer comprises a coupling slot;
    an antenna dielectric layer disposed on the circuit layer, and the antenna dielectric layer comprising a second dielectric material, wherein a thermal conductivity coefficient of the second dielectric material is less than a thermal conductivity coefficient of the first dielectric material;
    a metal plate disposed on the antenna dielectric layer, wherein the signal line is coupled to the metal plate via the coupling slot; and
    a chip connected to the signal line.

2. The antenna array module of claim 1, wherein the thermal conductivity coefficient of the first dielectric material is 3~6 W/m/K.

3. The antenna array module of claim 1, wherein the thermal conductivity coefficient of the first dielectric material is 2~8 W/m/K.

4. The antenna array module of claim 1, wherein the thermal conductivity coefficient of the circuit layer is 4~8 W/m/K.

5. The antenna array module of claim 1, wherein the thermal conductivity coefficient of the second dielectric material is 0.1~1 W/m/K and a loss tangent thereof is less than 0.008.

6. The antenna array module of claim 1, wherein the thermal conductivity coefficient of the second dielectric material is 0.1~1 W/m/K and a loss tangent thereof is 0.001~0.005.

7. The antenna array module of claim 1, wherein the thermal conductivity coefficient of the second dielectric material is 0.2~0.8 W/m/K and a loss tangent thereof is 0.0005~0.004.

8. The antenna array module of claim 1, further comprising a lateral cooling electrode disposed at one side of the circuit layer, and the lateral cooling electrode connected to the ground layer.

9. The antenna array module of claim 8, wherein the lateral cooling electrode comprises a plurality of electrode plates and there is an interval between any two adjacent electrode plates.

10. The antenna array module of claim 1, wherein the antenna dielectric layer further comprises a cavity under the metal plate.

11. The antenna array module of claim 10, wherein the cavity is disposed between the metal plate and the coupling slot.

12. The antenna array module of claim 1, further comprising an antenna protection layer disposed on the antenna dielectric layer, and the antenna protection layer covering the metal plate.

13. The antenna array module of claim 12, wherein the antenna protection layer comprises a third dielectric material and a thermal conductivity coefficient of the third dielectric material is 0.2~1 W/m/K.

14. The antenna array module of claim 12, wherein a transmittance of the antenna protection layer is greater than 80%.

15. The antenna array module of claim 1, wherein the circuit layer comprises a recess and the chip is disposed in the recess.

16. A method for manufacturing an antenna array module, comprising:
- forming a multi-layer stack structure comprising a signal line, a ground layer having a coupling slot and a first dielectric material to serve as a circuit layer, and forming a lateral cooling electrode at one side of the circuit layer;
- forming a second dielectric material on the circuit layer to serve as an antenna dielectric layer, wherein a thermal conductivity coefficient of the second dielectric material is less than a thermal conductivity coefficient of the first dielectric material;
- forming a metal plate on the antenna dielectric layer; and
- connecting the chip to the signal line.

17. The method of claim 16, further comprising:
forming a cavity in the second dielectric material.

18. The method of claim 16, further comprising:
forming an antenna protection layer on the antenna dielectric layer and covering the metal plate by the antenna protection layer.

* * * * *